United States Patent
Arai et al.

(10) Patent No.: US 10,194,534 B2
(45) Date of Patent: Jan. 29, 2019

(54) PRINTED WIRING BOARD, ELECTRONIC DEVICE, CATHETER, AND METALLIC MATERIAL

(71) Applicant: JX NIPPON MINING & METALS CORPORATION, Tokyo (JP)

(72) Inventors: Hideta Arai, Ibaraki (JP); Atsushi Miki, Ibaraki (JP); Satoru Morioka, Tokyo (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 15/654,801

(22) Filed: Jul. 20, 2017

(65) Prior Publication Data

US 2018/0035546 A1 Feb. 1, 2018

(30) Foreign Application Priority Data

Jul. 26, 2016 (JP) ................. 2016-145854

(51) Int. Cl.
| | |
|---|---|
| *H01R 13/00* | (2006.01) |
| *H05K 3/00* | (2006.01) |
| *H05K 1/02* | (2006.01) |
| *H05K 1/09* | (2006.01) |
| *H05K 3/02* | (2006.01) |
| *H05K 3/34* | (2006.01) |
| *H05K 3/46* | (2006.01) |
| *H05K 1/18* | (2006.01) |

(52) U.S. Cl.
CPC ........ *H05K 3/0061* (2013.01); *H05K 1/0206* (2013.01); *H05K 1/09* (2013.01); *H05K 3/025* (2013.01); *H05K 3/341* (2013.01); *H05K 3/4611* (2013.01); *H05K 3/4682* (2013.01); *H05K 1/0203* (2013.01); *H05K 1/189* (2013.01); *H05K 2201/0154* (2013.01); *H05K 2201/0355* (2013.01); *H05K 2201/10106* (2013.01); *H05K 2203/0353* (2013.01)

(58) Field of Classification Search
CPC ...... H05K 3/0061; H05K 1/0206; H05K 1/09; H05K 3/025; H05K 3/341; H05K 3/4611; H05K 3/4682; H05K 1/0203; H05K 1/189; H05K 2201/0154; H05K 2201/0355; H05K 2201/10106; H05K 2203/0353
USPC ................... 439/55, 190, 196, 485; 361/710
See application file for complete search history.

(56) References Cited

U.S. PATENT DOCUMENTS

| | | | | |
|---|---|---|---|---|
| 3,211,922 A | * | 10/1965 | Gregory et al. | ............. 257/664 |
| 9,036,352 B2 | * | 5/2015 | Engelhardt | ............ F28D 15/00 |
| | | | | 361/710 |
| 9,042,100 B2 | * | 5/2015 | Kang | ........................ G06F 1/20 |
| | | | | 257/713 |

(Continued)

FOREIGN PATENT DOCUMENTS

JP  08-078461 A  7/1997

*Primary Examiner* — Khiem Nguyen
(74) *Attorney, Agent, or Firm* — Drinker Biddle Reath LLP

(57) ABSTRACT

Provided herein is a printed wiring board that can desirably dissipate the heat of a heat-generating component. The printed wiring board includes one or more wires, and one or more heat-generating components. The one or more wires include a rolled copper foil, either partly or as a whole. The one or more heat-generating components and the one or more wires are directly or indirectly connected to each other.

20 Claims, 4 Drawing Sheets

(56) References Cited

U.S. PATENT DOCUMENTS

| | | | | |
|---|---|---|---|---|
| 9,426,932 B2* | 8/2016 | Kinstle | ............. | H05K 7/20809 |
| 10,042,402 B2* | 8/2018 | Eremenko | ............... | G06F 1/206 |

* cited by examiner

US 10,194,534 B2

PRINTED WIRING BOARD, ELECTRONIC DEVICE, CATHETER, AND METALLIC MATERIAL

TECHNICAL FIELD

The present invention relates to a printed wiring board, an electronic device, a catheter, and a metallic material.

BACKGROUND ART

The ongoing trend for smaller and higher resolution electronic devices has created problems, including failures due to heat generated from components used in the devices. A variety of means for releasing the heat of the components in electronic devices have been studied and developed (for example, Patent Literature 1).

CITATION LIST

Patent Literature

PTL 1: JP-A-08-078461

SUMMARY OF INVENTION

Technical Problem

Printed wiring boards used for electronic devices typically include components that generate heat during use. The heat from these components may lead to a failure unless it is properly released.

The present invention is intended to provide a printed wiring board that can desirably dissipate the heat generated by its components.

Solution to Problem

The present inventors conducted intensive studies, and focused on the wire that is directly or indirectly connected to the heat-generating components of a printed wiring board. It was found that the foregoing problem can be solved when the wire is formed using a rolled copper foil, or a material having a thermal conductivity of 330 W/(m·K) or more, either partly or as a whole, or when a plurality of extraction wires adapted to discharge heat of heat-generating components from a printed wiring board is provided for the wire.

The present invention was completed on the basis of this finding. In an aspect, the present invention is a printed wiring board that includes:
  one or more wires; and
  one or more heat-generating components,
  wherein the one or more wires include a rolled copper foil, either partly or as a whole, and
  wherein the one or more heat-generating components and the one or more wires are directly or indirectly connected to each other.

In another aspect, the present invention is a printed wiring board that includes:
  one or more wires; and
  one or more heat-generating components,
  wherein the one or more wires include, either partly or as a whole, a material having a thermal conductivity of 330 W/(m·K) or more, and
  wherein the one or more heat-generating components and the one or more wires are directly or indirectly connected to each other.

In yet another aspect, the present invention is a printed wiring board that includes:
  one or more wires; and
  one or more heat-generating components,
  wherein the one or more heat-generating components and the one or more wires are directly or indirectly connected to each other, and
  wherein the one or more wires are provided with a plurality of extraction wires that is adapted to discharge heat of the heat-generating components from the printed wiring board.

In still another aspect, the present invention is a printed wiring board that includes:
  one or more wires; and
  one or more heat-generating components,
  wherein the one or more wires include, either partly or as a whole, a material having an electrical conductivity of 88% IACS or more, and
  wherein the one or more heat-generating components and the one or more wires are directly or indirectly connected to each other.

In an embodiment of the printed wiring board of the present invention, one of the one or more heat-generating components, more than one of the one or more heat-generating components, or all of the one or more heat-generating components are light-emitting components.

In yet another embodiment of the printed wiring board of the present invention, one of the one or more heat-generating components, more than one of the one or more heat-generating components, or all of the one or more heat-generating components have a heat quantity of 0.5 mW or more per component in terms of a quantity of heat that generates upon passing electricity.

In still another embodiment of the printed wiring board of the present invention, at least one of the one or more wires has a length of 17 mm or more.

In yet another embodiment of the printed wiring board of the present invention, the one or more heat-generating components are directly or indirectly connected to the wire having a length or 18 mm or more.

In still another embodiment of the printed wiring board of the present invention, the one or more wires are configured from a metal having a maximum crystal grain size of 5.0 µm or more.

In yet another embodiment of the printed wiring board of the present invention, one of the heat-generating components, more than one of the heat-generating components, or all of the heat-generating components comprise at least one selected from the group consisting of light emitting diodes, laser semiconductors, laser-generating devices, camera modules, antennas, and communication devices.

In an aspect, the present invention is an electronic device that includes a printed wiring board of the present invention.

In another aspect, the present invention is a catheter that includes a printed wiring board of the present invention.

In yet another aspect, the present invention is a metallic material for use in a wire of a printed wiring board that comprises a heat-generating component, the metallic material having a maximum crystal grain size of 5.0 µm or more in a cross section parallel to a thickness direction after being heated at 350 to 370° C. for 2 seconds.

Advantageous Effects of Invention

The present invention provides a printed wiring board that can desirably dissipate the heat of a heat-generating component.

DESCRIPTION OF EMBODIMENTS

Figure 1:
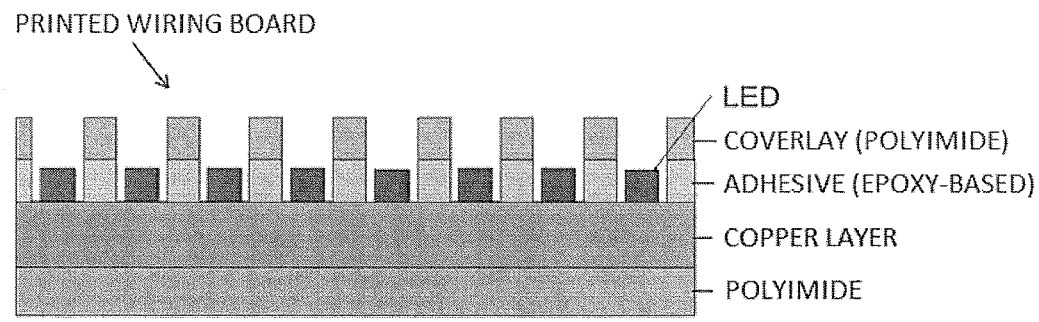
FIG. 1 is a schematic cross sectional view of the printed wiring board used in Examples.

In an embodiment, the printed wiring board of the present invention includes one or more wires, and one or more heat-generating components, wherein the one or more wires include a rolled copper foil, either partly or as a whole, and wherein the one or more heat-generating components and the one or more wires are directly or indirectly connected to each other. With the one or more wires of the printed wiring board including a rolled copper foil either partly or as a whole, the heat of the heat-generating components can desirably dissipate.

Preferably, the rolled copper foil is the phosphorus deoxidized copper (JIS H3100, alloy numbers C1201, C1220, C1221), the oxygen-free copper (JIS H3100, alloy number C1020; JIS H3510, alloy number C1011), or the tough-pitch copper (JIS H3100, alloy number C1100) specified by JIS H0500 and JIS H3100. As used herein, the "JIS standard" specifying the metals means the 2001 JIS standard, unless otherwise specifically stated.

The Cu concentration in the rolled copper foil is preferably 99.00 mass % or more, preferably 99.50 mass % or more, more preferably 99.60 mass % or more, further preferably 99.70 mass % or more, further preferably 99.90 mass % or more, further preferably 99.95 mass % or more, further preferably 99.96 mass % or more, further preferably 99.97 mass % or more, further preferably 99.98 mass % or more, even more preferably 99.99 mass % or more.

The rolled copper foil has an electrical conductivity of preferably 88% IACS or more, preferably 89% IACS or more, preferably 90% IACS or more, preferably 95% IACS or more, preferably 97% IACS or more, preferably 98% IACS or more, preferably 99% IACS or more, more preferably 99.3% IACS or more, more preferably 99.5% IACS or more, more preferably 99.7% IACS or more, more preferably 99.8% IACS or more, even more preferably 99.9% IACS or more, even more preferably 100.0% IACS or more. The upper limit of electrical conductivity is not particularly limited, and is typically 110% IACS or less, typically 109% IACS or less, typically 105% IACS or less, or typically 103% IACS or less.

In another embodiment, the printed wiring board of the present invention includes one or more wires, and one or more heat-generating components, wherein the one or more wires include a material having an electrical conductivity of 88% IACS or more, either partly or as a whole, and wherein the one or more heat-generating components and the one or more wires are directly or indirectly connected to each other. With the one or more wires of the printed wiring board including a material having an electrical conductivity of 88% IACS or more either partly or as a whole, the heat of the heat-generating components can desirably dissipate.

The electrical conductivity of the material is preferably 88% IACS or more, preferably 89% IACS or more, preferably 90% IACS or more, preferably 95% IACS or more, preferably 97% IACS or more, preferably 98% IACS or more, preferably 99% IACS or more, more preferably 99.3% IACS or more, more preferably 99.5% IACS or more, more preferably 99.7% IACS or more, more preferably 99.8% IACS or more, further preferably 99.9% IACS or more, further preferably 100.0% IACS or more. The upper limit of the electrical conductivity is particularly limited, but is typically 110% IACS or less, typically 109% IACS or less, typically 105% IACS or less, typically 103% IACS or less.

In yet another embodiment, the printed wiring board of the present invention includes one or more wires, and one or more heat-generating components, wherein the one or more wires include a material having a thermal conductivity of 330 W/(m·K) or more, either partly or as a whole, and wherein the one or more heat-generating components and the one or more wires are directly or indirectly connected to each other. With the one or more wires of the printed wiring board including a material having a thermal conductivity of 330 W/(m·K) or more either partly or as a whole, the heat of the heat-generating components can desirably dissipate.

The thermal conductivity of the "material having a thermal conductivity of 330 W/(m·K) or more" is preferably 340 W/(m·K) or more, more preferably 345 W/(m·K) or more, further preferably 350 W/(m·K) or more, further preferably 360 W/(m·K) or more, further preferably 370 W/(m·K) or more, further preferably 380 W/(m·K) or more, further preferably 385 W/(m·K) or more, further preferably 388 W/(m·K) or more, further preferably 390 W/(m·K) or more. The upper limit of the thermal conductivity of the material is not particularly limited, and is, for example, 2,000 W/(m·K) or less, 1,500 W/(m·K) or less, or 1,000 W/(m·K) or less.

The material having a thermal conductivity of 330 W/(m·K) or more may be, for example, a material containing at least one selected from the group consisting of resins, metals, ceramics, inorganic materials, and organic materials. The resin may be, for example, at least one selected from the group consisting of silicone resin, acrylic resin, urethane resin, ethylene propylene diene rubber, synthetic rubber, natural rubber, epoxy resin, polyethylene resin, polyphenylene sulfide (PPS) resin, polybutylene terephthalate (PBT) resin, fluororesin, polyimide resin, polycarbonate resin, liquid crystal polymers, polyamide resin, silicone oil, silicone grease, and silicone oil compounds. In the resin, at least one selected from the group consisting of metals, ceramics, inorganic materials, and organic materials may be contained as a filler or a bulking agent. The metal maybe an electrolytic copper foil, a copper plating layer, a non-electrolytic copper plating layer, or a dry copper plating layer. Preferred for use is an electrolytic copper foil because it desirably improves the productivity of the printed wiring board. The metals, the ceramics, the inorganic materials, and the organic materials maybe the same metals, ceramics, inorganic materials, and organic materials used for the resin layer. The metal may be a metal selected from the group consisting of Ag, Cu, N Zn, Au, Al, platinum-group elements, and Fe, or an alloy containing one or more of these elements. The ceramic may be at least one selected from the group consisting of oxides, nitrides, silicides, and carbides. The oxides may include at least one selected from the group consisting of aluminum oxide, silicon oxide, zinc oxide, copper oxide, iron oxide, zirconium oxide, beryllium oxide, titanium oxide, and nickel oxide. The nitrides may include at least one selected from the group consisting of boron nitride, aluminum nitride, silicon nitride, and titanium nitride. The silicides may include at least one selected from the group consisting of silicon carbide, molybdenum silicides (e.g., $MoSi_2$, $Mo_2Si_3$), tungsten silicides (e.g., $WSi_2$, $W_5Si_3$), tantalum silicides (e.g., $TaSi_2$), chromium silicides, and nickel silicides. The carbides may include at least one selected from the group consisting of silicon carbide, tungsten carbide, calcium carbide, and boron carbide. The inorganic materials may include at least one selected from the group consisting of carbon fiber, graphite, carbon nanotube, fullerene, diamond, graphene, and ferrite.

When the material having a thermal conductivity of 330 W/(m·K) or more is a metal, the thermal conductivity of the material can be controlled by controlling the crystal grain size. Specifically, the material can have a smaller thermal conductivity when the crystal grain size is made smaller, and a larger thermal conductivity when the crystal grain size is made larger. This is because the crystal grain boundary of the material is a factor that prevents a thermal motion. For example, smaller crystal grain sizes increase the number of crystal grain boundaries, and prevent a thermal motion in a corresponding fashion, with the result that the thermal conductivity of the material becomes smaller. Likewise, the number of crystal grain boundaries decreases as the crystal grain size is made larger. The effect of preventing a thermal motion becomes proportionally weak, and the thermal conductivity of the material increases.

In still another embodiment, the printed wiring board of the present invention includes one or more wires that are configured from, either partly or as a whole, a metal having a maximum crystal grain size of 5.0 μm or more in a cross section taken parallel to the thickness direction of the wires. With the one or more wires of the printed wiring board configured from, either partly or as a whole, a metal having a maximum crystal grain size of 5.0 μm or more, the heat of the heat-generating components can desirably dissipate. For desirable heat dissipation, the metal is preferably copper or a copper alloy, more preferably copper.

Observation of Maximum Crystal Grain Size of Metal in Cross Section Parallel to Thickness Direction of Wire The maximum crystal grain size of the metal in a cross section parallel to the thickness direction of the wires can be determined by capturing an SIM image after treating a metal cross section by FIB, and analyzing the captured image using the segment method. Specifically, the measurement may be made using the following procedures.

A single field of a thickness×300 μm-length area was viewed in a cross section parallel to the thickness direction of the metal (wire), and fully including the thickness direction of the metal. When the maximum crystal grain size was 300 μm or more, or when the maximum crystal grain was not confined within the field, observation was made for a measurement field of a length long enough to confine the maximum crystal grain. In the observed SIM image, three straight lines, equally spaced apart in the thickness direction of the metal, are drawn perpendicular to the metal thickness direction. The longest distance between the grain boundaries intersecting the line segments is taken as the maximum crystal grain size in the measurement field. The measurement was performed at three locations, and the largest maximum crystal grain size in these three locations was taken as the maximum crystal grain size of the metal in the cross section parallel to the thickness direction of the wire. Larger maximum crystal grain sizes mean higher thermal conductivity.

In the case of an electrolytic metal foil such as an electrolytic copper foil, the maximum crystal grain size can be increased by increasing the concentration of the organic material in an electrolytic solution used for production of the electrolytic metal foil. Conversely, the maximum crystal grain size can be made smaller by decreasing the concentration of the organic material used for production of the electrolytic metal foil.

In the case of a rolled copper foil, the maximum crystal grain size can be increased upon heating the metal in laminating the metal on resin after the final cold rolling, provided that the copper, which may be tough-pitch copper, oxygen-free copper, or phosphorus deoxidized copper, contains a total of not more than 500 mass ppm of at least one additive element selected from the group consisting of Sn, P, B, Ag, Au, Si, Ni, Mg, Mn, Al, Zn, C, Fe, As, Pb, Sn, Pt, Pd, Os, Rh, Ru, Ir, Re, and Co.

The maximum crystal grain size of the copper foil, regardless of whether it is a rolled copper foil or an electrolytic copper foil, also can be increased by heating the metal at an elevated temperature for a longer time period before or while laminating the foil over the resin.

As described above, the thermal conductivity of the material can be controlled by controlling the maximum crystal grain size in a cross section taken parallel to the thickness direction of the wire, and the wire can have improved thermal conductivity as the maximum crystal grain size in a cross section parallel to the wire thickness direction increases. The maximum crystal grain size of the metal in a cross section parallel to the wire thickness direction is preferably 5.0 μm or more, more preferably 10 μm or more, more preferably 20 μm or more, more preferably 30 μm or more, more preferably 40 μm or more, more preferably 50 μm or more, more preferably 60 μm or more, more preferably 70 μm or more, more preferably 80 μm or more, more preferably 90 μm or more, further preferably 100 μm or more, further preferably 200 μm or more, further preferably 300 μm or more, even more preferably 500 μm or more. The upper limit of the maximum crystal grain size in a cross section parallel to the wire thickness direction is not particularly limited, and is typically, for example, 1,500 μm or less, 1,200 μm or less, or 1,000 μm or less.

In yet another embodiment, the present invention is a metallic material for use in a wire of a printed wiring board having heat-generating components, and the metallic material has a maximum crystal grain size of 5.0 μm or more in a cross section parallel to the thickness direction after being heated at 350 to 370° C. for 2 seconds. The maximum crystal grain size in a cross section parallel to the thickness direction after heating at 350 to 370° C. for 2 seconds may be measured using the same method used for the measurement of the maximum crystal grain size of the metal in a cross section taken parallel to the wire thickness direction. With the metallic material used for the wires of the printed wiring board having heat-generating components, the heat of the heat-generating components can desirably dissipate. The heating conditions at 350 to 370° C. for 2 seconds simulate the conditions for lamination of the metallic material and the resin constituting the printed wiring board. For more desirable heat dissipation, the metallic material is preferably copper or a copper alloy, more preferably copper. The metallic material may be a copper foil, or a copper alloy foil. The metallic material may be a rolled copper foil, or a rolled copper alloy foil. The maximum crystal grain size of the metallic material in a cross section parallel to the thickness direction after heating at 350 to 370° C. for 2 seconds is more preferably 10 μm or more, more preferably 20 μm or more, more preferably 30 μm or more, more preferably 40 μm or more, more preferably 50 μm or more, more preferably 60 μm or more, more preferably 70 μm or more, more preferably 80 μm or more, more preferably 90 μm or more, further preferably 100 μm or more, further preferably 200 μm or more, further preferably 300 μm or more, further preferably 500 μm or more. The upper limit of the maximum crystal grain size is not particularly limited, and is typically, for example, 1,500 μm or less, 1,200 μm or less, or 1,000 μm or less.

In still another embodiment, the printed wiring board of the present invention is a printed wiring board that includes one or more wires, and one or more heat-generating components, wherein the one or more heat-generating components and the one or more wires are directly or indirectly connected to each other, and wherein a plurality of extraction wires adapted to discharge the heat of the heat-generating components from the printed wiring board is provided for the one or more wires. With the wires of the printed wiring board provided with the plurality of extraction wires adapted to discharge the heat of the heat-generating components from the printed wiring board, the heat of the heat-generating components can desirably dissipate. As used herein, "extraction wires" refers to wires other than the wires provided in portions where the heat-generating components are mounted, and "extraction wires" are wires that serve to discharge the heat of the heat-generating components from the printed wiring board. For example, the extraction wires may be of a form extending substantially perpendicularly or obliquely from the wires provided in portions where the heat-generating components are mounted, or of a form extending directly from the wires provided in portions where the heat-generating components are mounted. The extraction wires may be formed of, for example, a copper foil, a copper layer, a copper alloy foil, a copper alloy layer, an aluminum layer, an aluminum alloy layer, a nickel layer, a nickel alloy layer, iron, or an iron alloy layer. Preferably, the extraction wires are formed of a rolled copper foil, as with the case of the wires. Preferably, the rolled copper foil satisfies the electrical conductivity, and/or the copper concentration described above. As with the case of the wires, it is also preferable that the extraction wires satisfy the electrical conductivity, the thermal conductivity, the copper concentration, and/or the configuration described above.

As used herein, "heat-generating components" refers to components that generate heat during use. For example, the heat-generating components may be components that generate heat upon passing electricity, or components that generate heat upon chemical reaction. The heat-generating components also may be components that generate heat upon generating radio waves or electromagnetic waves, or upon transmitting or sending information through a wireless or wired means.

As used herein, "one or more heat-generating components and one or more wires are directly connected to each other" means that the one or more heat-generating components and the one or more wires are directly connected to each other either electrically or thermally. As used herein, "one or more heat-generating components and one or more wires are indirectly connected to each other" refers to when a plating layer, a surface treatment layer, other members, other circuits, etc., are present between the circuit and the components of the printed wiring board, and the circuit and the components are electrically or thermally connected to each other via such members.

As used herein, "electrically or thermally connected to each other" means a condition where passage of electricity or heat is allowed between the circuit and the components.

One of the heat-generating components, more than one of the heat-generating components, or all of the heat-generating components may light-emitting components. One of the heat-generating components, more than one of the heat-generating components, or all of the heat-generating components may comprise one or more selected from the group consisting of light emitting diodes (such as an organic light emitting diode (OLED)), laser semiconductors, laser-generating devices, camera modules, antennas, and communication devices.

One of the heat-generating components, more than one of the heat-generating components, or all of the heat-generating components may have a heat quantity of 0.5 mW or more, 1 W or more, or 1.2 W or more per component in terms of a quantity of heat that generates upon passing electricity.

Preferably, at least one of the wires has a length of 15 mm or more. At least one of the wires may have a length of 17 mm or more, 18 mm or more, 25 mm or more, 30 mm or more, mm or more, or 40 mm or more. The one or more heat-generating components may be directly or indirectly connected to wires having a length of 15 mm or more, 17 mm or more, 18 mm or more, 25 mm or more, 30 mm or more, 34 mm or more, or 40 mm or more. The heat-generating components connected to the wires can have more desirable heat dissipation when at least one of the wires has a length of 15 mm or more, 17 mm or more, 18 mm or more, 25 mm or more, 30 mm or more, 34 mm or more, or 40 mm or more.

Figure 2:
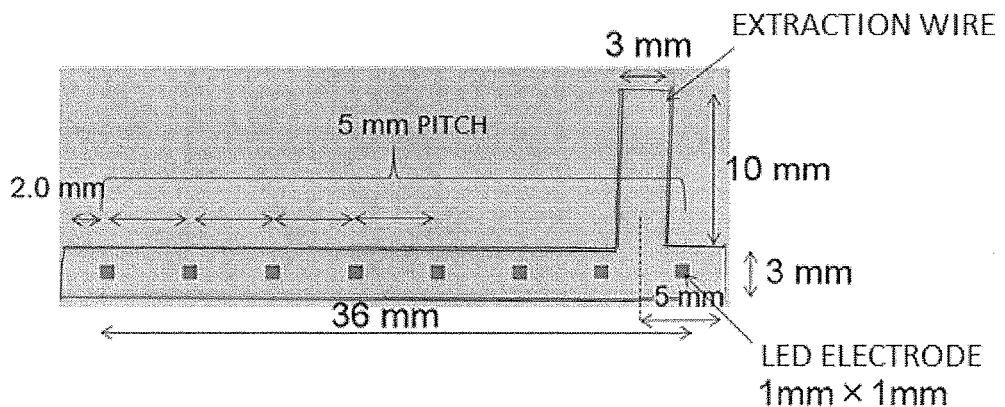
FIG. 2 is a schematic top view of the printed wiring board used in Examples.

As used herein, "wire length" means the distance from farthest (furthermost) end of the component at one end of the plurality of the mounted heat-generating components to the farthest (furthermost) end of the component at the other end of the mounted heat-generating components on the wire (for example, see FIG. 2).

A printed wiring board of the present invention includes a printed wiring board having components, a printed circuit board, and a printed board. Electronic components may be mounted on a printed wiring board of the present invention to produce a printed circuit board. The printed circuit board may be used for a range of electronic devices, including displays, IC chips, capacitors, inductors, connectors, terminals, memories, LSIs, cabinets, CPUs, circuits, and integrated circuits.

The printed circuit board may be used to produce an electronic device, and a printed circuit board with mounted electronic components may be used to produce an electronic device. An electronic device of the present invention includes electronic devices used in applications in contact with humans. Such applications range from, for example, portable electronic devices such as smartphones, cell phones, and tablets, to wearable electronic devices such as watches, bracelets, anklets, necklaces, badges, and sensors used by being installed in the body. An electronic device of the present invention also includes medical electronic devices such as endoscopes, and capsule endoscopes.

The printed wiring board of the present invention may be used for a visualizing portion, a sensor portion, or a data sending portion of a catheter. With such a configuration, a catheter can be provided that can discharge heat out of the body, and resist temperature increase during use. A catheter of the present invention includes medical catheters, and visualized catheters.

EXAMPLES

Examples 1 to 3, and Comparative Examples 1 to 3

A printed wiring board of the form shown in the schematic views of FIGS. 1 and 2 was prepared. As schematically shown in the cross sectional view of FIG. 1 and in the top view of FIG. 2, the printed wiring board is configured from a 12.5 μm-thick polyimide, a 25.0 μm-thick copper foil (a rolled copper foil or an electrolytic copper foil to be described later), a 10.0 μm-thick patterned adhesive (epoxy-based), and a 12.5-μm coverlay (polyimide), which are laminated in this order. The rolled copper foil was formed by rolling a copper foil to a thickness of 35 μm. In Examples 1 and 2, the surface of the rolled copper foil was subjected to a predetermined surface treatment, as will be described later. The rolled copper foil was laminated on the 12.5 μm-thick polyimide by applying pressure from the treated surface side for 2 seconds under the heat of 350° C. to 370° C. The other surface of the copper foil was etched until the copper foil had a thickness of 25 μm, using an aqueous solution of sulfuric acid (10 vol %) and hydrogen peroxide (3.0 wt %). LEDs (light-emitting diodes; heat-generating components) with a top surface area of 1 $mm^2$ (1 mm×1 mm) are provided on the copper foil (a rolled copper foil or an electrolytic copper foil to be described later), and between the patterned adhesive (epoxy-based) and the 12.5-μm coverlay (polyimide) at a total of 8 locations with a 5-mm pitch. The printed wiring board had a length of 36 mm, and a width of 3 mm. (Here, the length is the distance from farthest (furthermost) end of the LED at one end of the plurality of mounted LEDs to the farthest (furthermost) end of the LED at the other end of the mounted LEDs on the wire.) As illustrated in FIG. 2, an extraction wire, measuring 3 mm in width and 200 mm in length, and extending along the width direction of the printing wiring board was formed at one end of the length of the printed wiring board. The extraction wire was formed of a copper foil.

In Examples 1 to 3, rolled copper foil A was used as the copper foil. The rolled copper foil A has the composition of the tough-pitch copper specified in JIS H3100 alloy number C1100, with 200 mass ppm of Ag added to the composition. The rolled copper foil, 35 μm thick, was obtained by being cold rolled with an oil film equivalent of 25000 in the final step of production after repeated rolling and annealing. In Examples 1 and 2, one surface of the rolled copper foil was subjected to the following surface treatments, in order from a roughening treatment, a heat resistance treatment, an anti-corrosion treatment, a chromate treatment, and a silane coupling process.

Roughening Plating
 Cu: 10 to 20 g/L
 Co: 5 to 10 g/L
 Ni: 5 to 10 g/L
 pH: 1.5 to 3.5
 Temperature: 30 to 40° C.
 Current density: 10 to 30 A/$dm^2$
 Plating time: 1 to 5 s
Heat Resistance Treatment
 CoNi plating
 Co: 3 to 8 g/L
 Ni: 5 to 15 g/L
 pH: 1.5 to 3.5
 Temperature: 40 to 60° C.
 Current density: 1 to 10 A/$dm^2$
 Plating time: 0.1 to 10 s
Anti-Corrosion Treatment
 ZnNi plating
 Zn: 5 to 15 g/L
 Ni: 1 to 10 g/L
 pH: 2.5 to 4.5
 Temperature: 30 to 50° C.
 Current density: 1 to 10 A/$dm^2$
 Plating time: 0.1 to 10 s
Chromate Treatment
 Solution Composition
 Potassium dichromate: 1 to 10 g/L
 Zinc (added in the form of zinc sulfate): 0.05 to 5 g/L
 pH: 2 to 5
 Solution temperature: 50 to 70° C.
 Current density: 1.0 to 5.0 A/$dm^2$
 Energization time: 1 to 5 s
Silane Coupling Process
 Solution Composition
 Aqueous solution containing 0.5 to 1.5 vol % of N-2-(aminoethyl)-3-aminopropyltrimethoxysilane
 Solution temperature: 20 to 50° C.
 Process time: 1 to 30 s
The silane coupling process performed under the conditions above was followed by drying at 80 to 110° C.×5 to 60 seconds.

In Comparative Examples 1 to 3, electrolytic copper foil B was used as the copper foil. The electrolytic copper foil B was produced by electrolytic deposition of copper on a titanium drum from a copper sulfate plating bath. The electrolysis conditions are as follows.
Electrolysis Conditions
 Electrolytic Solution Composition
 Cu: 50 to 150 g/L
 $H_2SO_4$: 60 to 150 g/L
 Current density: 30 to 120 A/$dm^2$
 Electrolytic solution temperature: 50 to 60° C.
 Additives
 Chlorine ion: 20 to 80 mass ppm
 Glue: 0.01 to 5.0 mass ppm Example 1, and Comparative Example 1

Figure 3:
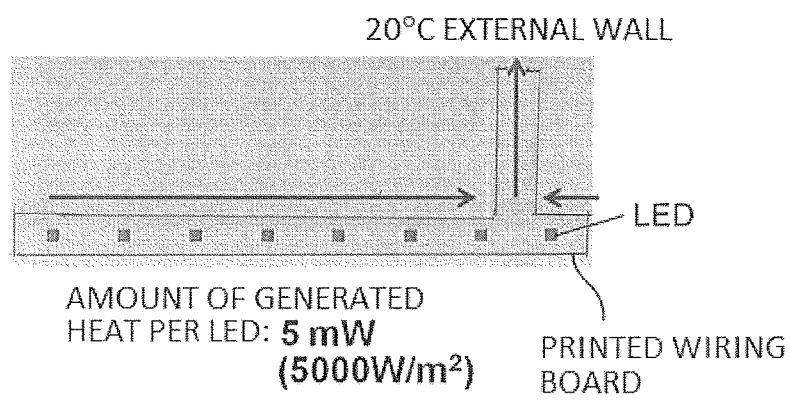
FIG. 3 is a schematic top view of the printed wiring boards of Example 1 and Comparative Example 1.

In the printed wiring board, the LEDs were made to generate 5 mW (5,000 W/$m^2$) of heat per LED, as shown in FIG. 3. The both sides of the printed wiring board were covered with a heat insulating material (glass wool), of 10 mm-thick. The printed wiring board was air cooled so that the tip of the extraction wire reached 20° C., and absorb the heat from the LEDs.

Example 2, and Comparative Example 2

Figure 4:
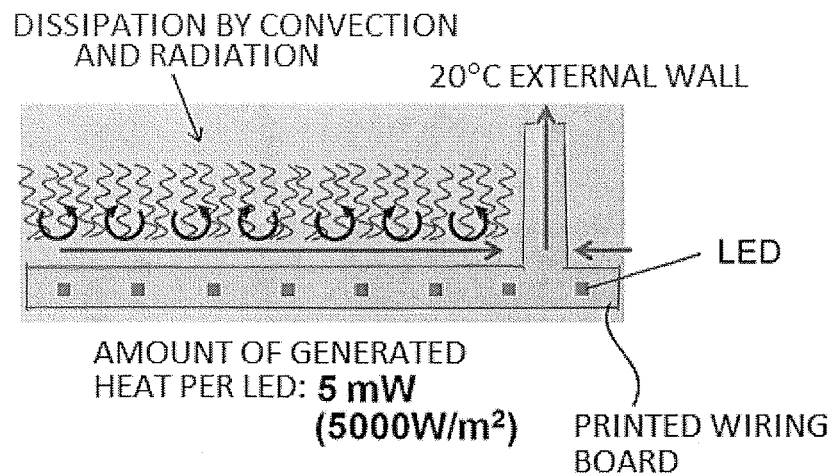
FIG. 4 is a schematic top view of the printed wiring boards of Example 2 and Comparative Example 2.

In the printed wiring board, the LEDs were made to generate 5 mW (5,000 W/$m^2$) of heat per LED, as shown in FIG. 4. The heat was dissipated by convection and radiation from the surface of the printed wiring board. The printed wiring board was air cooled so that the tip of the extraction wire reached 20° C., and absorb the heat from the LEDs. Here, the convective heat transfer coefficient was 6 W/$m^2$·K (ambient temperature 20° C.). An aluminum cover was installed around the printed wiring board, at a distance of 5 mm from the printed wiring board. The printed wiring board was supported at the both ends and in the middle with a raised portion (φ=3 mm) installed on the printed wiring board side of the cover. Inside of the cover was subjected to a black alumite treatment (anodization treatment). The radiation factor on the inner side of the cover after the black alumite treatment was 0.95. The cover was air cooled, and the temperature was controlled at 20° C.

Example 3, and Comparative Example 3

Figure 5:
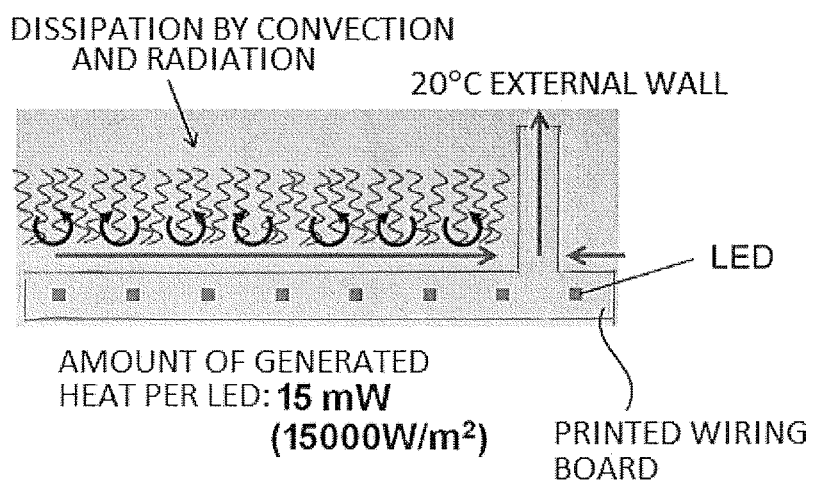
FIG. 5 is a schematic top view of the printed wiring boards of Example 3 and Comparative Example 3.

In the printed wiring board, the LEDs were made to generate 15 mW (15,000 W/m$^2$) of heat per LED, as shown in FIG. 5. Other conditions are the same as in Example 2 and Comparative Example 2.

Examples 4 and 5, and Comparative Example 4

The printed wiring board of the form shown in the schematic views of FIGS. 1 and 2 was prepared.

In Example 4, electrolytic copper foil B was used as the copper foil. In Example 5, rolled copper foil D was used. The rolled copper foil D was produced in the same manner as for the rolled copper foil A, except that the rolled copper foil D had the composition of the oxygen-free copper (JIS H3100 alloy number C1020) with 100 mass ppm of silver added to the composition. In Comparative Example 4, electrolytic copper foil A was used. The electrolytic copper foil A was produced by electrolytic deposition of copper on a titanium drum from a copper sulfate plating bath. The electrolysis conditions are as follows.
Electrolysis Conditions
    Electrolytic Solution Composition
    Copper sulfate: 70 g/L (in terms of a copper concentration)
    Sulfuric acid concentration: 70 g/L
    Chlorine concentration: 30 ppm
    Glue: 33 mg/L
    Current density: 50 A/dm$^2$
    Electrolytic solution temperature: Liquid temperature of 45° C.

A 25 μm-thick wire was prepared for Examples 4 and 5, and Comparative Example 4.

The printed wiring board was tested under the following conditions A, B, and C.
Condition A
    The same conditions as in Example 1 except for the copper foil, with the LEDs made to generate 5 mW (5,000 W/m$^2$) of heat per LED.
Condition B
    The same conditions as in Example 2 except for the copper foil, with the LEDs made to generate 5 mW (5,000 W/m$^2$) of heat per LED.
Condition C
    The same conditions as in Example 3 except for the copper foil, with the LEDs made to generate 15 mW (15,000 W/m$^2$) of heat per LED.

Examples 6 to 8

Figure 6:
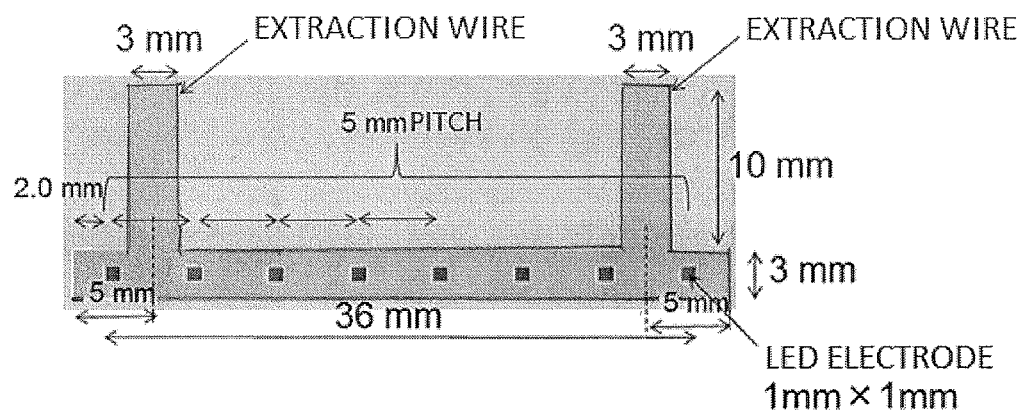
FIG. 6 is a schematic top view of the printed wiring boards of Examples 6 to 8.

The printed wiring board of the form shown in the schematic top view of FIG. 6 was prepared. The cross section is the same as that schematically shown in FIG. 1. The printed wiring board shown in FIG. 6 is the same as the printed wiring board shown in FIG. 2, except that the extraction wire extends from the both ends of the wire at two locations.

In Example 6, electrolytic copper foil A was used as the copper foil. In Example 7, electrolytic copper foil B was used. In Example 8, rolled copper foil A was used.

A 25 μm-thick wire was prepared for Examples 6 to 8.

The printed wiring board was tested by setting the conditions A to C as in Examples 4 and 5 and Comparative Example 4, and the heat from the LEDs was absorbed.

Examples 9 and 10, and Comparative Example 5

Figure 7:
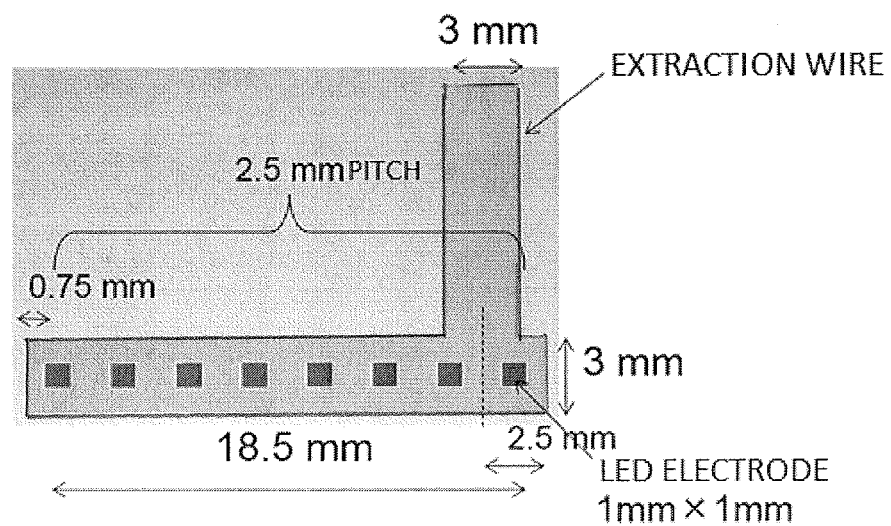
FIG. 7 is a schematic top view of the printed wiring boards of Examples 9 and 10, and Comparative Example 5.

The printed wiring board of the form shown in the schematic top view of FIG. 7 was prepared. The cross section is the same as that schematically shown in FIG. 1. LEDs (light-emitting diodes; heat-generating components) with a top surface area of 1 mm$^2$ (1 mm×1 mm) are provided on the copper foil, and between the patterned adhesive (epoxy-based) and the 12.5-μm coverlay (polyimide) at a total of 8 locations with a 2.5-mm pitch. The printed wiring board had a length of 18.5 mm, and a width of 3 mm. (Here, the length is the distance from farthest (furthermost) end of the LED at one end of the plurality of mounted LEDs to the farthest (furthermost) end of the LED at the other end of the mounted LEDs on the wire.) An extraction wire, measuring 3 mm in width and 10 mm in length, and extending along the width direction of the printing wiring board was formed at one end of the length of the printed wiring board. The extraction wire was formed of a copper foil.

In Comparative Example 5, electrolytic copper foil A was used as the copper foil. In Example 9, electrolytic copper foil B was used. In Example 10, rolled copper foil A was used.

A 25 μm-thick wire was prepared for Examples 9 and 10, and Comparative Example 5.

The printed wiring board was tested by setting the conditions A to C as in Examples 4 and 5 and Comparative Example 4, and the heat from the LEDs was absorbed.

Examples 11 and 12, and Comparative Example 6

Figure 8:
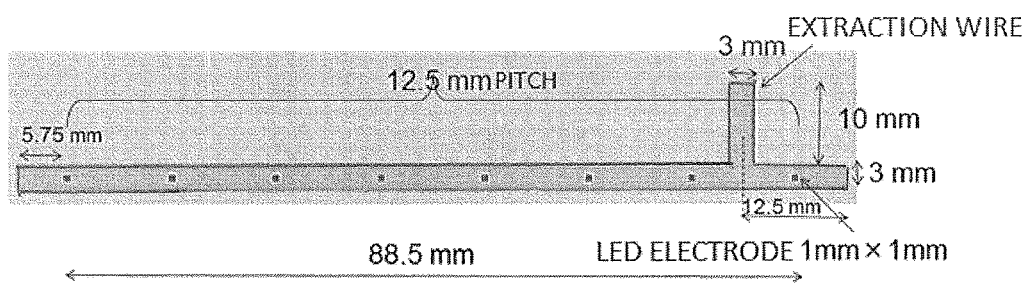
FIG. 8 is a schematic top view of the printed wiring boards of Examples 11 and 12, and Comparative Example 6.

The printed wiring board of the form shown in the schematic top view of FIG. 8 was prepared. The cross section is the same as that schematically shown in FIG. 1. LEDs (light-emitting diodes; heat-generating components) with a top surface area of 1 mm$^2$ (1 mm×1 mm) are provided on the copper foil, and between the patterned adhesive (epoxy-based) and the 12.5-μm coverlay (polyimide) at a total of 8 locations with a 12.5-mm pitch. The printed wiring board had a length of 88.5 mm, and a width of 3 mm. (Here, the length is the distance from farthest (furthermost) end of the LED at one end of the plurality of mounted LEDs to the farthest (furthermost) end of the LED at the other end of the mounted LEDs on the wire.) An extraction wire, measuring 3 mm in width and 10 mm in length, and extending along the width direction of the printing wiring board was formed at one end of the length of the printed wiring board. The extraction wire was formed of a copper foil.

In Comparative Example 6, electrolytic copper foil A was used as the copper foil. In Example 11, electrolytic copper foil B was used. In Example 12, rolled copper foil A was used.

A 25 μm-thick wire was prepared for Examples 11 and 12, and Comparative Example 6.

The printed wiring board was tested by setting the conditions A to C as in Examples 4 and 5 and Comparative Example 4, and the heat from the LEDs was absorbed.

Experiments were conducted to simulate dissipation in the printed wiring boards of Examples and Comparative Examples under the following conditions.

Steady analysis
Flow, laminar flow, and gravity were taken into consideration
Heat quantity of heat generator: as specified above
The tip of the extraction wire was regarded as a 20° C. wall
The printed wiring board other than the LEDs had an adiabatic setting (Condition A for Examples 1 to 3 and Comparative Examples 1 to 3, and Examples 4 to 12 and Comparative Examples 4 to 6)
The printed wiring board including the LEDs had an exoergic setting (Conditions B and C for Examples 4 to 12 and Comparative Examples 4 to 6)
Ambient temperature: 20° C.
Surface coefficient of heat transfer: 6 W/m²·K
The wall opposite the side under radiation heat was regarded as a 20° C. black body
Radiation in solid was disregarded Radiation Factor Incident light on a sample surface is absorbed inside, aside from being reflected and transmitted. Absorbance ($\alpha$;=radiation factor($\varepsilon$)), reflectance (r), and transmittance (t) are related as to satisfy the following formula.

$$\varepsilon + r + t = 1 \quad (A)$$

The radiation factor ($\varepsilon$) can be determined from reflectance and transmittance, as follows.

$$\varepsilon = 1 - r - t \quad (B)$$

In the equation, t becomes zero, and the radiation factor is determined solely by reflectance when the sample is nontransparent, or has a thickness large enough to make the passage of light negligible.

$$\varepsilon = 1 - r \quad (C)$$

The sample used did not pass infrared light. Accordingly, formula (C) was applied, and the radiation factor was calculated for each wavelength of light.

FT-IR Spectrum

The mean value of two measurements was used to provide a reflectance spectrum. The reflectance spectrum was corrected with the reflectance of diffuse gold (nominal wavelength region: 2 to 14 μm).

From the radiation energy distribution calculated using Plank's equation for a black body at a certain temperature, the radiation energy intensity $E_{s\lambda}$ of the sample can be represented by $E_{s\lambda} = \varepsilon\lambda \cdot E_{b\lambda}$, where $E_{b\lambda}$ is the energy intensity at each wavelength $\lambda$, and $\varepsilon\lambda$ is the radiation factor of the sample at each wavelength $\lambda$. In the Example, the radiation energy intensity $E_{s\lambda}$ of the sample at 25° C. was determined using the equation $E_{s\lambda} = \varepsilon\lambda \cdot E_{b\lambda}$.

The total energy of a blackbody or a sample in a certain wavelength region is determined as the integral values of $E_{s\lambda}$ and $E_{b\lambda}$ in the wavelength range, and the total radiation factor $\varepsilon$ is represented by the ratio of these values (Formula A). In the Example, the total radiation factor $\varepsilon$ of each sample was calculated in a wavelength region of 2 to 14 μm at 25° C. using the formula. The calculated total radiation factor s was then taken as the radiation factor of the sample.

$$\varepsilon = \int_{\lambda=2}^{\lambda=14} E_{s\lambda} d\lambda / \int_{\lambda=2}^{\lambda=14} E_{b\lambda} d\lambda \quad (A)$$

Table 1 shows the calculation conditions for Examples 1 to 12 and Comparative Examples 1 to 6, and the physical property values calculated for these Examples and Comparative Examples. The thermal conductivity of each copper foil was measured with a thermophysical measurement device (TPS2500S) using a hot disc method. The electrical conductivity and thermal conductivity measurements were performed after heating the copper foil at 350 to 370° C.×2 seconds (after laminating the copper foil on the resin, or after heating the copper foil under these conditions when the measurement did not involve lamination).

TABLE 1

| Physical properties of material | Density (kg/m³) | Specific heat (J/kg · K) | Thermal conductivity (W/m · K) | Radiation factor |
|---|---|---|---|---|
| Polyimide | 1400 | 1130 | 0.3 | 0.9 (Estimate) |
| Adhesive | 1850 | 1100 | 0.3 | Unused |
| Electrolytic copper foil A | 8978 | 381 | 300 | Unused |
| Electrolytic copper foil B | 8978 | 381 | 350 | Unused |
| Rolled copper foil A | 8978 | 381 | 390 | Unused |
| Rolled copper foil D | 8978 | 381 | 400 | Unused |

Tables 2 to 6 show the simulation results (the highest temperatures of the printed wiring boards) of the test conducted for the printed wiring boards (flexible printed wiring boards: FPC) of Examples 1 to 12, and Comparative Examples 1 to 6. The electrical conductivity was measured using the four probe method.

TABLE 2

| | Highest temperature of printed wiring board (° C.) |
|---|---|
| Example 1 | 54.2 |
| Comparative Example 1 | 58.1 |
| Example 2 | 31.3 |
| Comparative Example 2 | 31.7 |
| Example 3 | 52.8 |
| Comparative Example 3 | 53.8 |

TABLE 3

| | | Electrical conductivity of wire (% IACS) | Thermal conductivity of wire (W/m × K) | Condition A LED heat quantity: 5 mW Adiabatic condition FPC highest temperature (° C.) | | Condition B LED heat quantity: 5 mW Exoergic condition FPC highest temperature (° C.) | | Condition C LED heat quantity: 15 mW Exoergic condition FPC highest temperature (° C.) | |
|---|---|---|---|---|---|---|---|---|---|
| | | | | Wire thickness 25 μm | Wire thickness 50 μm | Wire thickness 25 μm | Wire thickness 50 μm | Wire thickness 25 μm | Wire thickness 50 μm |
| Com. Ex. 4 | Electrolytic copper foil A | 80 | 300 | 65.3 | 42.7 | 32.2 | 29.7 | 55.3 | 48.4 |

TABLE 3-continued

|  |  | Electrical conductivity of wire (% IACS) | Thermal conductivity of wire (W/m × K) | Condition A LED heat quantity: 5 mW Adiabatic condition FPC highest temperature (° C.) | | Condition B LED heat quantity: 5 mW Exoergic condition FPC highest temperature (° C.) | | Condition C LED heat quantity: 15 mW Exoergic condition FPC highest temperature (° C.) | |
|---|---|---|---|---|---|---|---|---|---|
|  |  |  |  | Wire thickness 25 μm | Wire thickness 50 μm | Wire thickness 25 μm | Wire thickness 50 μm | Wire thickness 25 μm | Wire thickness 50 μm |
| Ex. 4 | Electrolytic copper foil B | 90 | 350 | 58.8 | 39.4 | 31.7 | 29.1 | 54 | 46.6 |
| Ex. 5 | Rolled copper foil D | 101 | 400 | 53.8 | 36.4 | 30.4 | 27.6 | 52 | 44.4 |

TABLE 4

|  |  | Electrical conductivity of wire (% IACS) | Thermal conductivity of wire (W/m × K) | Condition A LED heat quantity: 5 mW Adiabatic condition FPC highest temperature (° C.) Wire thickness 25 μm | Condition B LED heat quantity: 5 mW Exoergic condition FPC highest temperature (° C.) Wire thickness 25 μm | Condition C LED heat quantity: 15 mW Exoergic condition FPC highest temperature (° C.) Wire thickness 25 μm |
|---|---|---|---|---|---|---|
| Ex. 6 | Electrolytic copper foil A | 80 | 300 | 34.1 | 27.5 | 42.3 |
| Ex. 7 | Electrolytic copper foil B | 90 | 350 | 32.7 | 26.9 | 40.5 |
| Ex. 8 | Rolled copper foil A | 100 | 390 | 30.8 | 26.5 | 39.3 |

TABLE 5

|  |  | Electrical conductivity of wire (% IACS) | Thermal conductivity of wire (W/m × K) | Condition A LED heat quantity: 5 mW Adiabatic condition FPC highest temperature (° C.) Wire thickness 25 μm | Condition B LED heat quantity: 5 mW Exoergic condition FPC highest temperature (° C.) Wire thickness 25 μm | Condition C LED heat quantity: 15 mW Exoergic condition FPC highest temperature (° C.) Wire thickness 25 μm |
|---|---|---|---|---|---|---|
| Com. Ex. 5 | Electrolytic copper foil A | 80 | 300 | 51.7 | 36.1 | 66.7 |
| Ex. 9 | Electrolytic copper foil B | 90 | 350 | 47.2 | 34.9 | 63.3 |
| Ex. 10 | Rolled copper foil A | 100 | 390 | 44.4 | 34 | 61 |

TABLE 6

|  |  | Electrical conductivity of wire (% IACS) | Thermal conductivity of wire (W/m × K) | Condition B LED heat quantity: 5 mW Exoergic condition FPC highest temperature (° C.) Wire thickness 25 μm | Condition C LED heat quantity: 15 mW Exoergic condition FPC highest temperature (° C.) Wire thickness 25 μm |
|---|---|---|---|---|---|
| Com. Ex. 6 | Electrolytic copper foil A | 80 | 300 | 26.1 | 37.8 |
| Ex. 11 | Electrolytic copper foil B | 90 | 350 | 26 | 37.6 |
| Ex. 12 | Rolled copper foil A | 100 | 390 | 26 | 37.4 |

Observation of Crystal Grain Size of Copper Foil

For the measurement of the crystal grain size of the copper foil, a SIM image was captured after treating a cross section of the copper foil by FIB, and the captured image was analyzed by using the segment method. The maximum crystal grain size in a cross section taken parallel to the thickness direction of the wire was then determined. Specifically, the measurement was made using the following procedures.

A single field of a thickness×300 μm-length area was viewed in a cross section parallel to the thickness direction of the copper foil, and fully including the thickness direction of the copper foil. When the maximum crystal grain size in a cross section parallel to the thickness direction of the wire was 300 µm or more, or when the maximum crystal grain was not confined within the field, observation was made for a measurement field of a length long enough to confine the maximum crystal grain. In the observed SIM image, three straight lines, equally spaced apart in the thickness direction of the copper foil, are drawn perpendicular to the thickness direction. The longest distance between the grain boundaries intersecting the line segments is taken as the maximum crystal grain size in the measurement field. The measurement was performed at three locations, and the largest maximum crystal grain size in these three locations was taken as the maximum crystal grain size of the copper foil in the cross section parallel to the thickness direction of the wire. Larger maximum crystal grain sizes in a cross section parallel to the thickness direction of the wire mean higher thermal conductivity.

In the case of an electrolytic metal foil (electrolytic copper foil), the maximum crystal grain size can be increased by increasing the concentration of the organic material in an electrolytic solution used for production of the electrolytic metal foil (electrolytic copper foil). Conversely, the maximum crystal grain size can be made smaller by decreasing the concentration of the organic material used for production of the electrolytic metal foil (electrolytic copper foil).

In the case of a rolled copper foil, the maximum crystal grain size can be increased upon heating the metal in laminating the metal on resin after the final cold rolling, provided that the copper, which may be tough-pitch copper, oxygen-free copper, or phosphorus deoxidized copper, contains a total of not more than 500 mass ppm of at least one additive element selected from the group consisting of Sn, P, B, Ag, Au, Si, Ni, Mg, Mn, Al, Zn, C, Fe, As, Pb, Sn, Pt, Pd, Os, Rh, Ru, Ir, Re, and Co. The maximum crystal grain size of the copper foil, regardless of whether it is a rolled copper foil or an electrolytic copper foil, also can be increased by heating the metal at an elevated temperature for a longer time period before or while laminating the foil over the resin.

As described above, the thermal conductivity of the material can be controlled by controlling the maximum crystal grain size, and the thermal conductivity improves as the maximum crystal grain size increases. The maximum crystal grain size of the metal in a cross section parallel to the thickness direction of the wire is preferably 5.0 µm or more, more preferably 10 µm or more, more preferably 20 µm or more, more preferably 30 µm or more, more preferably 40 µm or more, more preferably 50 µm or more, more preferably 60 µm or more, more preferably 70 µm or more, more preferably 80 µm or more, more preferably 90 µm or more, further preferably 100 µm or more, further preferably 200 µm or more, further preferably 300 µm or more, even more preferably 500 µm or more. The upper limit of the maximum crystal grain size in a cross section parallel to the thickness direction of the wire is not particularly limited, and is typically, for example, 1,500 µm or less, 1,200 µm or less, or 1,000 µm or less.

The results of the observation of the maximum crystal grain size in a cross section parallel to the wire thickness direction in the copper foils used in Examples and Comparative Examples are as follows. The maximum crystal grain size in a cross section parallel to the wire thickness direction was measured after the production of the printed wiring board. The thickness direction of the wire, and the thickness direction of the copper foil are the same. Accordingly, in Examples and Comparative Examples, the maximum crystal grain size in a cross section parallel to the thickness direction of the copper foil is the same as the maximum crystal grain size in a cross section parallel to the thickness direction of the wire.

Rolled copper foil A: 200 µm
Rolled copper foil D: 100 µm
Electrolytic copper foil A: 4 µm
Electrolytic copper foil B: 8 µm In the present application, priority is claimed based on Japanese Patent Application No. 2016-145854 filed on Jul. 26, 2016, and the entire contents of the Japanese Patent Application are incorporated herein by reference.

What is claimed is:

1. A printed wiring board comprising:
one or more wires; and
one or more heat-generating components,
wherein the one or more wires satisfy, either partly or as a whole, at least one of the following conditions (A) to (C):
(A) the one or more wires include a rolled copper foil, either partly or as a whole,
(B) the one or more wires include, either partly or as a whole, a material having a thermal conductivity of 330 W/(m·K) or more, and
(C) the one or more wires include, either partly or as a whole, a material having an electrical conductivity of 88% IACS or more, and
wherein the one or more heat-generating components and the one or more wires are directly or indirectly connected to each other.

2. A printed wiring board comprising:
one or more wires; and
one or more heat-generating components,
wherein the one or more heat-generating components and the one or more wires are directly or indirectly connected to each other, and
wherein the one or more wires are provided with a plurality of extraction wires that is adapted to discharge heat of the heat-generating components from the printed wiring board.

3. The printed wiring board according to claim 1, wherein one of the one or more heat-generating components, more than one of the one or more heat-generating components, or all of the one or more heat-generating components are light-emitting components.

4. The printed wiring board according to claim 2, wherein one of the one or more heat-generating components, more than one of the one or more heat-generating components, or all of the one or more heat-generating components are light-emitting components.

5. The printed wiring board according to claim 1, wherein one of the one or more heat-generating components, more than one of the one or more heat-generating components, or all of the one or more heat-generating components have a heat quantity of 0.5 mW or more per component in terms of a quantity of heat that generates upon passing electricity.

6. The printed wiring board according to claim 1, wherein at least one of the one or more wires has a length of 17 mm or more.

7. The printed wiring board according to claim 6, wherein the one or more heat-generating components are directly or indirectly connected to the wire having a length or 17 mm or more.

8. The printed wiring board according to claim 1, wherein the one or more wires are configured from, either partly or as a whole, a metal having a maximum crystal grain size of 5.0 μm or more in a cross section taken parallel to a thickness direction of the wire.

9. The printed wiring board according to claim 2, wherein the one or more wires are configured from, either partly or as a whole, a metal having a maximum crystal grain size of 5.0 μm or more in a cross section taken parallel to a thickness direction of the wire.

10. The printed wiring board according to claim 3, wherein the one or more wires are configured from, either partly or as a whole, a metal having a maximum crystal grain size of 5.0 μm or more in a cross section taken parallel to a thickness direction of the wire.

11. The printed wiring board according to claim 4, wherein the one or more wires are configured from, either partly or as a whole, a metal having a maximum crystal grain size of 5.0 μm or more in a cross section taken parallel to a thickness direction of the wire.

12. The printed wiring board according to claim 1, wherein one of the heat-generating components, more than one of the heat-generating components, or all of the heat-generating components comprise at least one selected from the group consisting of light emitting diodes, laser semiconductors, laser-generating devices, camera modules, antennas, and communication devices.

13. An electronic device comprising the printed wiring board of claim 1.

14. An electronic device comprising the printed wiring board of claim 2.

15. An electronic device comprising the printed wiring board of claim 8.

16. An electronic device comprising the printed wiring board of claim 9.

17. A catheter comprising the printed wiring board of claim 1.

18. A catheter comprising the printed wiring board of claim 2.

19. A catheter comprising the printed wiring board of claim 3.

20. A catheter comprising the printed wiring board of claim 4.

* * * * *